United States Patent
Wilson et al.

[11] 4,001,718
[45] Jan. 4, 1977

[54] LINEAR OSCILLATOR FOR PROXIMITY SENSOR

[75] Inventors: Michael A. Wilson; Gordon E. Gee, both of Sarasota; Fred J. Momparler, Bradenton, all of Fla.

[73] Assignee: Electro Corporation, Sarasota, Fla.

[22] Filed: May 12, 1975

[21] Appl. No.: 576,897

[52] U.S. Cl. .................... 331/65; 324/34 PS; 324/34 GT; 331/117 R; 331/186; 340/258 C
[51] Int. Cl.² .................. G01R 33/12; G08C 21/00
[58] Field of Search ............ 331/65, 117 R, 168, 331/186; 324/34 D, 34 PS, 34 E, 34 GT; 340/258 C, 266

[56] References Cited
UNITED STATES PATENTS

| | | | |
|---|---|---|---|
| 2,883,538 | 4/1959 | Elam | 331/65 |
| 3,609,580 | 9/1971 | Thompson et al. | 331/65 |
| 3,743,853 | 7/1973 | Dittman et al. | 307/116 |

OTHER PUBLICATIONS

National Semiconductor Linear Integrated Circuits Manual 1973, pp. 2-173.

*Primary Examiner* — Siegfried H. Grimm
*Attorney, Agent, or Firm* — Wegner, Stellman, McCord, Wiles & Wood

[57] ABSTRACT

A proximity sensor oscillator, having a resonant circuit in which the power loss is inversely related to the distance of a conductive body from a probe containing a part of the resonant circuit, produces an oscillating output signal in the resonant circuit with a peak amplitude that varies with power loss and distance. A power source provides either the current or the voltage component of electrical power at a substantially constant value independent of changes of resonant circuit power loss and is periodically switched to the resonant circuit to provide an average input power thereto. The power loss of the resonant circuit loads the source, and thus the other component of power oscillates within the resonant circuit at a peak amplitude linearly related to the inverse of the power loss. A control circuit is responsive to the phase of the oscillating component to maximize power input to the resonant circuit by applying the fixed power component substantially only throughout each alternate half wave of the oscillating component having the same polarity sense as the one component. Over the operating range where the inverse of the power loss has a linear variation with distance, the peak amplitude of the oscillating component varies linearly with distance. A detector circuit responsive to the amplitude of the oscillating component provides an indication of distance.

16 Claims, 10 Drawing Figures

LINEAR OSCILLATOR FOR PROXIMITY SENSOR

BACKGROUND OF THE INVENTION

This invention relates, generally, to a resonant circuit oscillator for a metal proximity sensor and, particularly, to a proximity oscillator of the type which produces an output with a peak amplitude that varies as a function of target distance, the distance of a metal body or target from a probe containing a part of the resonant circuit.

Proximity sensors are known which utilize a resonant circuit oscillator having an output amplitude that varies in accordance with the distance between a conductive body and a probe containing a part of the resonant circuit. In such sensors, a level detector provides an output indication in response to the output oscillation assuming an amplitude corresponding to a selected distance.

Feedback oscillators of the Hartley or Colpitts type are commonly used which have an inductance coil of an LC resonant circuit contained in a probe. The transfer function of the feedback portion of the oscillator is established, in part, by the effective load impedance Q and power loss of the resonant circuit including the inductance coil of the probe. Within a certain range of distance from the probe, commonly less than an inch, eddy current losses in a metal body or target load the resonant circuit. This loading can be analytically expressed in terms of the effective parallel circuit resistance which varies directly with target distance or the effective equivalent series resonant circuit resistance which varies inversely with distance.

Movement of the target toward the probe decreases the effective parallel resistance and increases the power loss of the resonant circuit. Likewise, as the distance between the probe and the target increases, the effective parallel resistance of the resonant circuit increases and the power loss decreases.

In these feedback oscillators, the relationship between resonant circuit power loss and oscillator output amplitude is substantially nonlinear. For a range of relatively short distances between the probe and the target, the power losses of the resonant circuit are so high that the feedback loop gain is too low to sustain oscillations. Over this range of relatively short distances, changes in the resonant circuit power loss have virtually no effect on the output. When the power loss decreases to a value at which the loop gain is sufficiently high so that the oscillator amplifier enters its active region, oscillation amplitude increases with decrease in power loss. This relationship continues through the active region of the amplifier. Through a small portion of the active region of the amplifier, oscillator amplitude is linearly related to the inverse of power loss. Upon the power loss decreasing to the point where the amplifier reaches saturation, the peak output amplitude is achieved and further decreases in power loss have no effect. The nonlinearity of the oscillator output is due primarily to its feedback operation.

Nonlinearity of proximity sensors is due primarily to the oscillator, and not to probe characteristics. Many sensing probes have a linear relation between the inverse of the power loss (or the effective resistance) and distance from a conductive body for a distance range which is substantially greater than the linear range of the oscillator. But most of the linear range of the probe cannot be advantageously employed because the oscillator is nonlinear.

The characteristics of feedback oscillators present a number of problems which detract from their utility in proximity sensor applications. The nonlinearity of the oscillator makes difficult calibrated adjustment of the relationship between output magnitude and distance. The feedback operation makes these known oscillators susceptible to temperature instability and mechanical noise problems.

The frequency response of these oscillators is also severely limited. The gain of the oscillator amplifier must often be kept low to maximize the linear range, and this degrades the frequency response of the oscillator. Oscillators of the Hartley and Colpitts type are easily loaded to the point where they cease to oscillate completely, and this further degrades the response time thereof.

Further, prior art sensors with oscillators of this type typically use as detectors level comparators with large amounts of hysteresis to cover up the instabilities in the oscillator. The wide excursions in oscillator voltage required for a level comparator with large amounts of hysteresis still further degrade the response time of the sensor.

SUMMARY OF THE INVENTION

The disadvantages of known proximity sensor oscillators are substantially overcome by the linear oscillator of the present invention in which the peak amplitude of oscillation varies linearly with the inverse of the power loss of a probe over a substantial range of distance. This advantageous result is achieved by periodically switching a power source having one fixed power component (i.e., current or voltage) to the resonant circuit so that the one component of the average input power to the resonant circuit is maintained at a constant magnitude. Unlike the known feedback oscillators, this one component of input power does not vary with changes in load, i.e., changes in the effective impedance and Q of the resonant circuit, or with changes in the value of the other power component which oscillates within the resonant circuit. Over a substantial portion of the linear range of the probe, peak amplitude of the other power component varies linearly with target distance.

The theory of operation is based principally on the fact that at steady state, with the resonant circuit oscillating at a constant amplitude, the power loss of the resonant circuit is equal to the power input to the resonant circuit. Power loss varies inversely with the effective parallel resistance, or directly with the effective series resistance of the resonant circuit, respectively, depending upon whether the fixed component is current or voltage. Power loss also varies directly with the square of the oscillating power component. The input power is proportional to the product of the fixed component and the oscillating component and because the one component is fixed and does not vary, the other component which is oscillating in the resonant circuit varies linearly with target distance over the linear range of the probe.

In one embodiment, a fixed voltage component is periodically applied across the resonant circuit in accordance with the phase of the oscillating current in the resonant circuit. The peak amplitude of the oscillating current component varies linearly with the inverse of the effective series resistance of the resonant circuit and thus linearly with target distance.

In another embodiment, a constant current is periodically applied to the resonant circuit in accordance with the phase of the voltage component which oscillates within the resonant circuit. The oscillating voltage amplitude varies linearly with the effective parallel resistance of the resonant circuit and thus linearly with target distance.

In a specific circuit embodiment of the current source form of the invention, a current mirror circuit provides a current to the resonant circuit having a magnitude equal to the magnitude of a reference current. A reference current source is connected in series with each of a pair of differential voltage control switches. One of the voltage control switches is connected in series between the reference current source and the input of the current mirror source and applies reference current thereto when in a conductive state. The other switch provides an alternate path for the reference current when the one switch is in a non-conductive state so that the reference current source is kept in a steady state condition. When the oscillating voltage amplitude exceeds a selected positive value, the one switch connected to the mirror circuit input is turned on to connect the reference current source to the mirror circuit input, and the other switch is turned off. When the oscillating voltage amplitude decreases below a second selected value, the one switch connected to the mirror circuit is turned off and the other switch providing the alternate path conducts the full amount of reference current therethrough.

An important feature of the linear oscillator is that different linear relationships between output voltage and resonant circuit effective resistance may be selected by varying the magnitude of the reference current source. Specifically, in the current source embodiment, for instance, the oscillating voltage amplitude is directly proportional to the reference current magnitude. Thus, by simply increasing the reference current magnitude, the distance corresponding to a given output voltage amplitude may be decreased.

A further feature of the linear oscillator is that a high output voltage will be provided in the event of an open probe, i.e., an open inductance coil condition, and a low output voltage will be provided in the unlikely event of an overload to the resonant circuit. Thus, these two conditions can be readily distinguished from one another. In the prior art sensor, a low output voltage results from the occurrence of either of these two conditions, and separate curcuitry must be provided to distinguish between them.

Yet another feature of the invention is that the frequency response is only limited by the band pass of the resonant circuit. The response time of the oscillator is substantially equivalent to that of a simple low pass filter. Further, overload conditions, which degrade the response time and often occur in prior art oscillators, are substantially avoided.

Thus, it is a principal objective of the present invention to provide an oscillator of high frequency response for use in proximity and distance sensors which produces an output oscillation having a peak amplitude that varies linearly with target distance.

The foregoing features and advantages will become more apparent and further features and advantages of the linear oscillator will be disclosed in the description of the preferred embodiments and the drawing taken in conjunction therewith.

BRIEF DESCRIPTION OF THE DRAWING

The following description of the preferred embodiments will be given with reference to the drawing, in which.

DESCRIPTION OF THE PREFERRED EMBODIMENT

Figure 1:
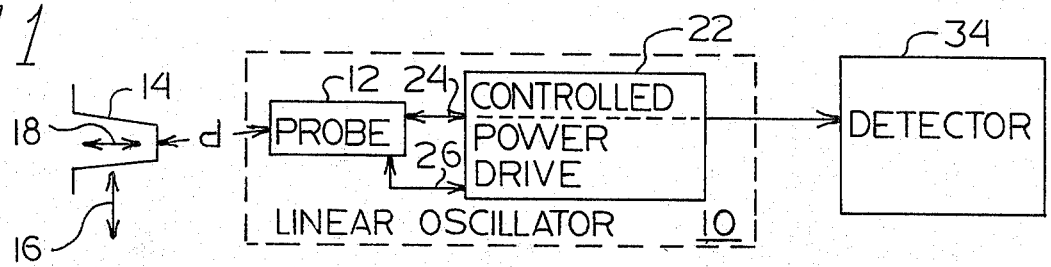
FIG. 1 is a block diagram of the linear oscillator in combination with a detector as used to sense the distance between a conductive body and the oscillator probe.

Referring to FIG. 1 of the drawing, the linear oscillator 10 is used in a sensor to measure a target distance d. The target distance d is the distance between a probe 12 containing at least a part of a resonant circuit and a movable target 14 made from a conductive metal. The target distance d may vary due to lateral movement of target 14 past the probe in the direction indicated by double-headed arrow 16 or may be the result of movement of the target 14 directly toward and away from probe 12 as indicated by the double-headed arrow 18. Target 14 may take various forms. For instance, movement of the target in the lateral direction 16 may be representative of movement of one of a plurality of equally spaced gear teeth on a rotating wheel.

Figure 2:
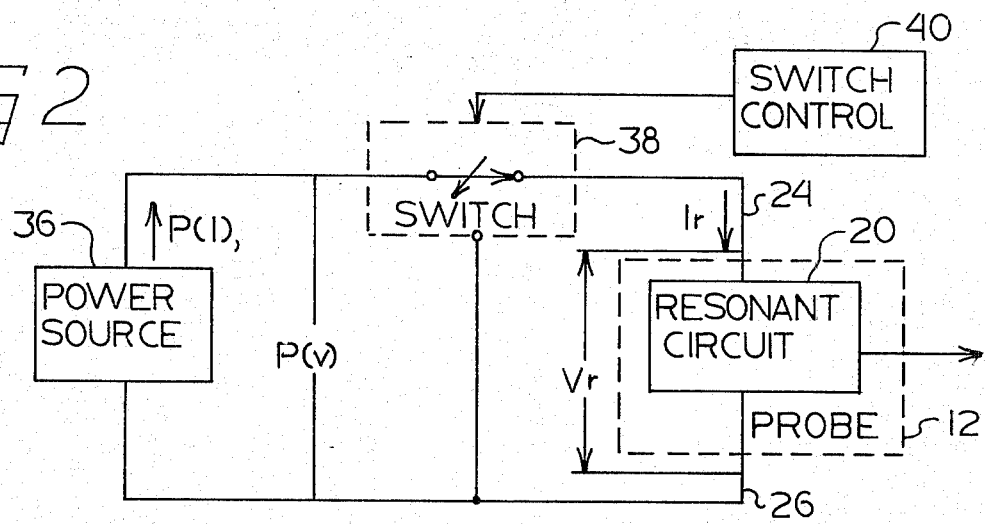
FIG. 2 is a block diagram illustrating a general form of the linear oscillator.

Probe 12 typically comprises a suitable protective housing (not shown) containing at least a part of a resonant circuit 20, usually an inductance coil, as seen in FIG. 2. This part of the resonant circuit 20 is connected to a controlled power drive circuit 22 of the linear oscillator 10 through leads 24 and 26. In the LC resonant circuit shown in FIG. 3A, the inductor 28 is provided by an inductance coil of the probe, and the capacitor 30 connected in parallel therewith is partly representative of cable capacitance developed along the length of leads 24 and 26. The resonant circuit 20 may also be represented by an LC series resonant circuit having an inductor 29 and a capacitor 32 connected in series therewith as seen in FIG. 4A.

The controlled power drive circuit 22 periodically applies a source of power to the resonant circuit of probe 12 and an alternating current flows in the coil. The current sets up an alternating magnetic field around the coil 28 which in turn produces eddy currents in the metal target, resulting in power losses in the resonant circuit. As the target distance decreases, resonant circuit power loss increases, and as the target distance $d$ increases, the power loss decreases. The power loss of the resonant circuit is represented by an effective parallel resistance Rp of the parallel resonant circuit, FIG. 3A, and by an effective series resistance Rs of the series resonant circuit, FIG. 4A. The effective parallel resonant circuit resistance Rp varies directly with the target distance, and the effective series resonant circuit resistance Rs varies inversely with target distance $d$. In fact, referring to FIG. 5, which is a graph of the effective parallel resistance Rp of an exemplary probe as a function of target distance $d$, it is seen that the effective parallel resistance Rp is linearly related to target distance $d$ over a range of target distance $d$ from zero to about 125 mils. Most sensor probes have a substantial linear range comparable to that shown in FIG. 5. The inverse of effective series resistance Rs likewise varies linearly with target distance $d$ over a substantial range in most probes.

Referring now to FIG. 2, the controlled power drive circuit 22 is seen to comprise a power source 36 and means for switching the power source to the resonant circuit 20 to provide an average power thereto, including a switch 38 and a control circuit 40 therefor. Power source 36 provides to the resonant circuit 20 when switched thereto one of the current and voltage components of electrical power P(I) and P(V), respectively, at a magnitude that is substantially independent of the changes of load resistance to the power source and independent of te magnitude of the other power component. The control circuit 40 functions to cause the switch 38 to change periodically between one state in which the one power component is applied to the resonant circuit and another state in which the one power component is not applied to the resonant circuit. The power source is switched to the resonant circuit such that the average value of the one nonvarying component of input power remains substantially constant.

The resonant circuit 20 is a load to the source. Since the one component of input power is constant, the other component of input power, which oscillates within the resonant circuit, has a peak amplitude that varies with the effective resistance and power loss of the resonant circuit.

Specifically, the peak amplitude of oscillations produced in the resonant circuit is linearly related to the effective parallel resistance Rp or the inverse of the effective series resistance Rs, respectively, depending upon whether the power source provides a constant current or constant voltage.

Figures 5, 6:
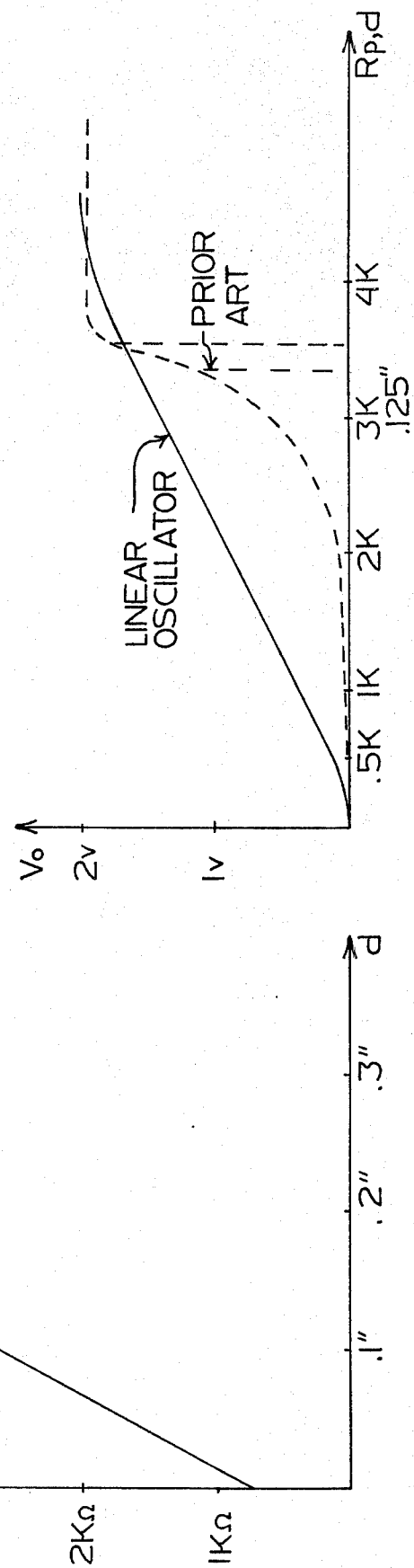
FIG. 5 is a graph of target distance d, i.e., the distance of a probe from a conductive body vs. the effective parallel resistance RP of a typical probe.
FIG. 6 is a graph of effective parallel resistance Rp and target distance d vs. the peak output voltage Vo of a typical probe as used with the linear oscillator of FIG. 3A, shown in solid line, and as used with an exemplary oscillator of the prior art, shown in broken line.

When the sensor is measuring distances within the linear range of the probe, the peak amplitude of the resonant circuit oscillations is linearly related to target distance $d$. This is illustrated in FIG. 6, which is a plot of a typical variation in peak voltage amplitude Vo as a function of target distance $d$ and effective parallel resistance Rp for the linear oscillator shown in FIG. 3A. The linear oscillator output, indicated in solid line, is seen to be linear over a substantial range. On the other hand, the output of a known feedback oscillator, indicated in broken line, is seen to be substantially nonlinear, having only a very narrow linear range which occurs when the feedback transfer function and oscillator amplifier are both in their linear range.

The remaining component of the sensor is a detector circuit 34 which may be any suitable device responsive to the output amplitude of linear oscillator 10 to sense target distance. In its simplest form, detector 34 could comprise an amplitude meter having a scale graduated in terms of distance. Another suitable type of indicator may simply produce an output pulse in response to the amplitude exceeding a particular value corresponding to a selected distance.

Figure 3A:
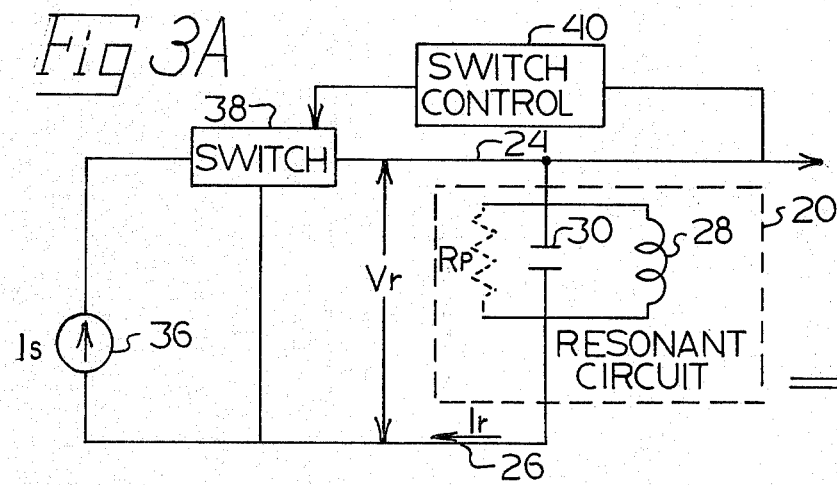
FIG. 3A is a block diagram of an embodiment of the linear oscillator in which a current source is periodically switched to the resonant circuit.
Figure 4A:
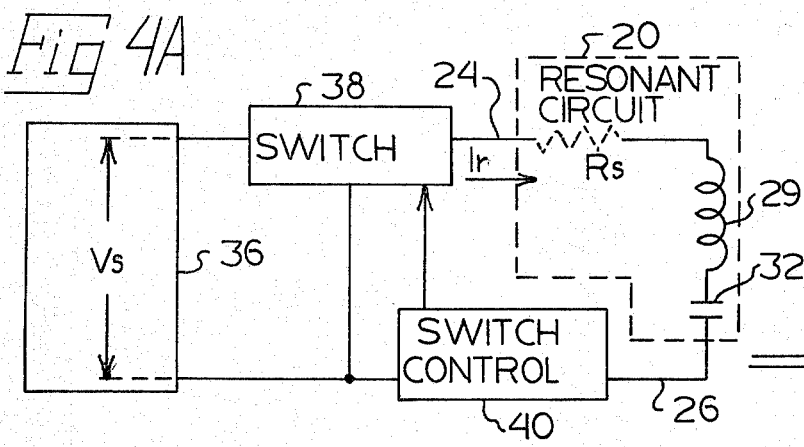
FIG. 4A is a block diagram of another embodiment of the linear oscillator in which a voltage source is periodically switched to the resonant circuit.

Referring to FIG. 3A, a particular embodiment of the linear oscillator, in which power source 36 is a current source is shown. Power source 36 (in this embodiment of the linear oscillator) provides an output current having a selected amplitude Is, which is substantially independent of changes in load to the source. An oscillating voltage is developed in the resonant circuit having an instantaneous magnitude Vr and a peak amplitude Vo. The source voltage Vs is equal to the load voltage across the resonant circuit Vr when current Is is being applied thereto. At steady state, the peak voltage amplitude Vo is constant. This occurs when the power input of the resonant circuit is equal to the power loss of the resonant circuit. When the current source 36 is periodically switched to the resonant circuit, so that the average input current to the resonant circuit is substantially constant, the power input Pin to the resonant circuit is expressed by Equation 1.

EQUATION 1

$$Pin = K_1 Is Vo$$

where
$K_1$ = constant
($V$.

Power loss $P_L$ is expressed by Equation 2.

EQUATION 2.

$$P_L = (V_o^2/2Rp)$$

Equating the expressions for Pin and $P_L$ and solving for the peak voltage amplitude Vo across the resonant circuit, an expression for Vo is obtained which is given by Equation 3.

EQUATION 3

$$Vo = 2K_1 Is Rp$$

As previously explained, the current amplitude Is of the power source is constant. Thus, it is seen from Equation 3 that the peak voltage amplitude Vo is directly porportional to the effective parallel resistance Rp of the probe. Since over a range of target distance, the effective parallel resistance Rp varies linearly with target distance, the peak voltage amplitude Vo is linearly related to target distance $d$ over that range.

Figure 3B:
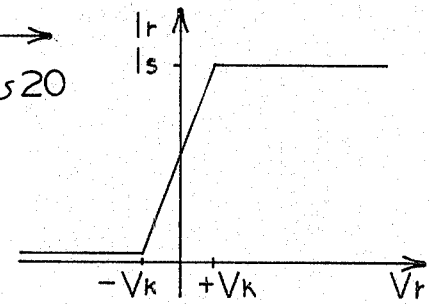
FIG. 3B is a graph of the instantaneous output voltage Vr vs. input current Ir of the resonant circuit of the linear oscillator of FIG. 3A.

If power source 36 provides current Is in only one polarity direction, then maximum power input and thus maximum peak voltage output for a given effective parallel resistance Rp is achieved by controlling switch 37 so that the instantaneous current input Ir equals Is when Vr has a polarity of the same sense as that of Is, and Ir is equal to zero when Vr is of a polarity of the opposite sense of that of Is. That is, to achieve maximum input power, the current source is switched to the resonant circuit throughout each positive half wave of the oscillating voltage signal. As a practical matter, the ideal cannot normally be achieved due to switching offset characteristics of electronic devices used to perform this function. This might prevent the initial application of current to the resonant circuit necessary or oscillator start. Accordingly, a small linear region of current transition is provided about the zero value of Vr which ensures the application of current to the resonant circuit at zero voltage, as seen in FIG. 3B.

In the embodiment of the linear oscillator shown in FIG. 4A, power source 36 is a voltage source producing an output voltage having an amplitude Vs. This constant voltage is periodically switched across resonant circuit 20 through switch 38 to apply a nonzero average input power thereto. Application of the voltage Vs to resonant circuit 20 results in development therein of an oscillating current Ir having a peak amplitude Io. Switch control circuit 40 is responsive to the phase of the oscillating resonant circuit current Ir, as indicated by the instantaneous amplitude thereof, to cause switch 38 to change states periodically such that the average value of input voltage to the resonant circuit remains substantially constant.

As with the current source embodiment of FIG. 3A, the average input power Pin is represented by Equation 4.

EQUATION 4

$$Pin = K_2 Vs Io$$

where
$K_2$ = constant

The average power loss $P_L$ is expressed by Equation 5.

EQUATION 5

$$P_L = \tfrac{1}{2} Rs Io^2$$

When a steady state condition is achieved, with the peak current amplitude being constant, Pin equals $P_L$. Thus, equating the respective expressions of input power and power loss respectively given by Equations 3 and 4, and solving the equation for the peak resonant circuit current amplitude Io, an expression for Io is obtained, given by Equation 6.

EQUATION 6

$$Io = 2K_2 Vs (1/Rs)$$

As can be appreciated from Equation 6, because Vs is a constant, the peak current amplitude will vary directly with the inverse of the effective series resistance Rs of the resonant circuit 20. The inverse of the effective resistance of the resonant circuit is directly proportional to the effective parallel resistance Rp, and thus is also directly proportional to the target distance $d$. Accordingly, within the linear range of probe, the current amplitude Io will vary linearly with target distance $d$.

As with the current source embodiment of FIG. 3A, maximum input power is transferred to the resonant circuit from a single polarity or DC voltage source when the voltage is applied throughout each alternate half wave of the oscillating current of a polarity of like sense of the voltage source polarity. Again, for practical reasons, this ideal cannot normally be achieved, and thus for a practical circuit, the transfer function provided by switch control circuit 40 and switch 38 is that shown in FIG. 4B. The switch 38 is operated to apply full power supply voltage Vs in response to the oscillating current assuming a first positive selected amplitude +Ik, and the power supply voltage Vs is substantially completely removed from the resonant circuit when the oscillating current decreases below a second selected amplitude −Ik equal in magnitude to +Ik. Between these two selected values, the voltage varies directly with current to ensure oscillator start.

Figures 7, 8:
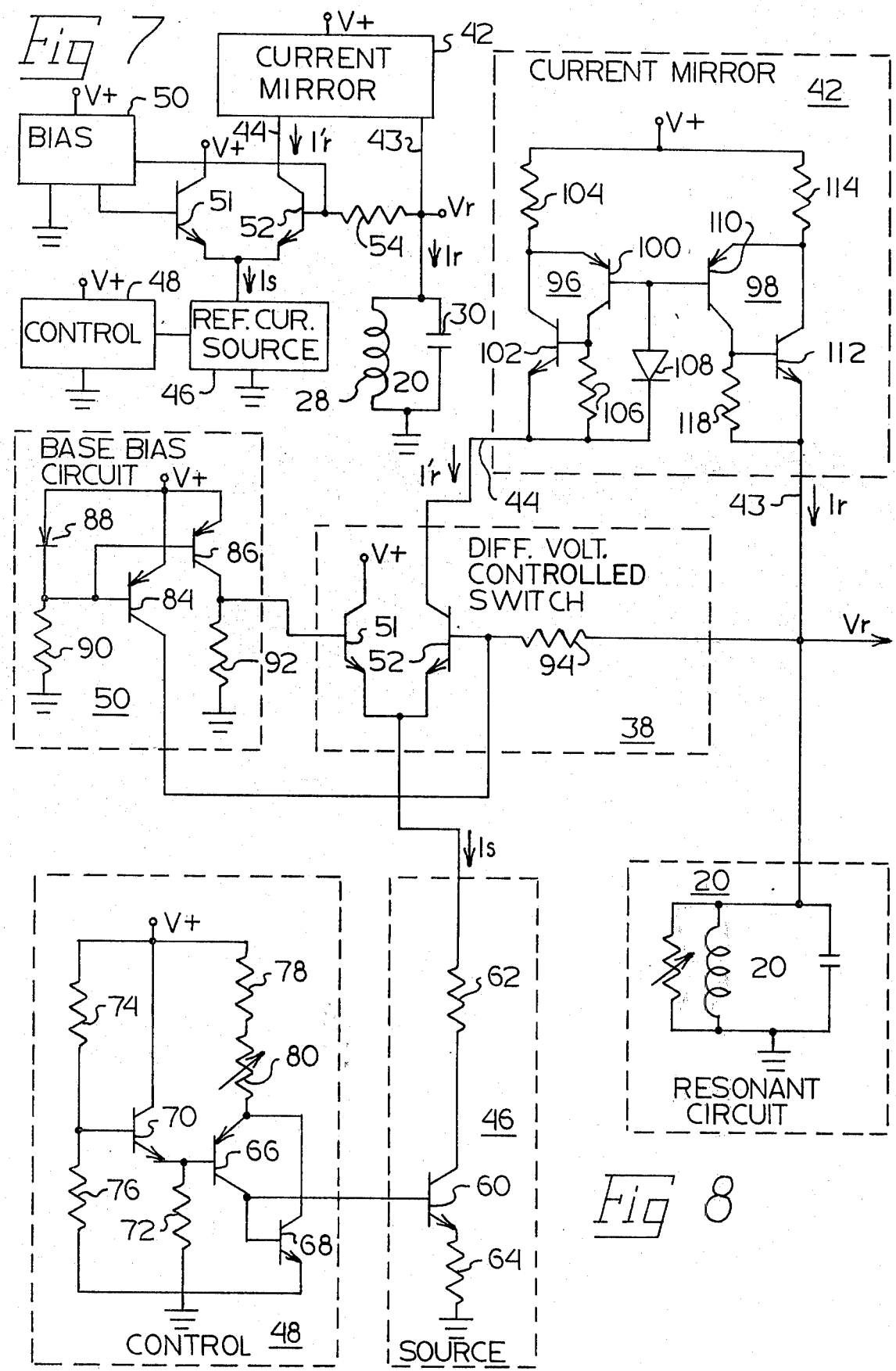
FIG. 7 is a detailed block diagram of a specific embodiment of the linear oscillator of the type shown in FIG. 3A.
FIG. 8 is a circuit schematic of the linear oscillator shown in block diagram form in FIG. 7.

Referring now to FIG. 7 and 8, a specific circuit embodiment for the current source form of the linear oscillator shown in FIG. 3A will be described. Referring first to FIG. 7, the controlled power drive circuit 22 for resonant circuit 20 operates to apply a current Ir periodically to the resonant circuit in accordance with the oscillating voltage Vr in the manner illustrated in the plot of voltage Vr versus current Ir shown in FIG. 3B. The input current Ir is applied to the resonant circuit 20 by a current controlled mirror circuit 42 through an output 43 thereof. The magnitude of Ir is controlled solely by the magnitude of a reference current I'r applied to an input 44 of the current mirror circuit 42. Specifically, as will be explained in more detail below, the resonant circuit current Ir is equal to the control input current I'r. Thus, the graph of I'r as a function of Vr is identical to that of Ir shown in FIG. 3B.

The control current I'r is applied to the current mirror circuit through a transistor switch 52 connected between a reference current source 46 and input 44. Reference current source 46 provides an output current having a substantially constant magnitude Is which is selected and regulated by a control circuit 48. Another transistor switch 51 connected in parallel with transistor switch 52 and current mirror circuit 42 and in series with reference current source 46 provides an alternate path for reference source current Is.

Reference source current Is is alternately conducted by transistor switches 51 and 52. A base bias circuit 50 provides base bias and drive to each of transistors 51 and 52 and also establishes the selected switching levels −Vk and +Vk.

The value of reference input current I'r is dependent upon the conductive state of transistor switch 52 which, in turn, is controlled by the magnitude of the instantaneous resonant circuit voltage Vr. The base of transistor 52 is connected to the resonant circuit 20 through a resistor 54. The base bias circuit 51 provides a base bias to transistors 50 and 52 such that transistor 52 is in cutoff at values of Vr less than −Vk and begins to conduct upon the oscillating voltage Vr exceeding −Vk, which may be approximately −50 millivolts. Due to base drive provided by bias circuit 50, transistor 52 is rapidly driven through its linear range and reaches saturation when the resonant circuit voltage Vr exceeds +Vk, approximately +50 millivolts. At saturation, the magnitude of reference source current Is is applied to input 44. At cutoff, virtually no current is applied to input 44.

As stated, the principal purpose of transistor 51 is to provide an alternate current path for reference current Is so that it may be maintained in a constant steady state value. As transistor 52 begins to turn off as the oscillating voltage descreases below +Vk, the transistor 51 begins to turn on and reaches saturation upon transistor 52 reaching cutoff. Likewise, as transistor 52 enters its linear region and then turns on in saturation, transistor 51 begins to turn off from saturation and enters its cutoff region upon transistor 52 reaching saturation. Referring to FIG. 2, transistor 52 being on and transistor 51 being off corresponds to the switch 38 shown in FIG. 2 being in the one position as shown connecting the source 36 to the resonant circuit and transistor 52 being off and transistor 51 being on corresponds to switch 38 being in the other position. Transistors 51 and 52 are matched transistors with regard to their switching characteristics insofar as that is possible, and between them conduct the full magnitude of Is at all times.

Circuit schematics of the functional circuit blocks of the linear oscillator illustrated in FIG. 7 are shown in FIG. 8. The reference current source 46 comprises an NPN transistor 60. Its collector is connected to the emitters of both transistors 51 and 52 through a resistor 62, and its emitter is connected through a resistor 64 to ground. The base of transistor 60 is provided with a fixed base current established by control circuit 48 of a magnitude in the active region of transistor 60. The base current establishes the magnitude of the reference current Is conducted through transistor 60.

Control curcuit 48 is a series-regulated current source. Series regulation is provided by a PNP transistor 66 and an NPN transistor 68. The collector of transistor 68 is connected to the emitter of transistor 66, and the collector of transistor 66 is connected to the base of transistor 68 in a common configuration for series regulation. Base drive for source transistor 60 is taken from the junction between the collector of transistor 66 and the base of transistor 68. A fixed base drive to transistor 66 is provided by an NPN transistor 70 having its collector coupled directly to a DC voltage V+ and its emitter connected to ground through an emitter load resistor 72. The base input to transistor 66 is taken from the junction of emitter load resistor 72 and the emitter of transistor 70. Base bias for transistor 70 is taken from the junction between a pair of base bias resistors 74 and 76 connected between DC voltage V+ and ground.

A variable resistor 80 provides means for selectively altering the reference current Is, the resonant circuit drive current Ir and thus the linear relationship between peak voltage amplitude Vo and target distance $d$. The emitter of transistor 66 is coupled to DC voltage V+ through a fixed emitter load resistor 78 and variable resistor 80 connected in series therewith. By varying the value of resistor 80, the base drive to source transistor 60 is varied. In turn this varies the magnitude of reference source current Is and reference input current I'r. Increasing reference input current I'r increases Ir and the peak voltage amplitude Vo corresponding to a given target distance $d$. Graphically, referring to FIG. 6, the slope of the peak voltage output curve as a function of target distance is directly proportional to the magnitude of Is.

Base bias circuit 50 includes a matched pair of PNP transistors 84 and 86, both of which are provided with base bias current from the junction between a diode 88 and a resistor 90 connected in series between DC voltage V+ and ground. The emitters of both transistors 84 and 86 are connected to DC voltage V+. The collector of transistor 86 is connected to the base of the alternate current path switch 51 and provides base drive thereto. The collector is also connected to ground through a base bias resistor 92 which functions as a collector load resistor for transistor 86. Transistor 84 has its collector connected to the base of reference current transistor 52 to provide base drive thereto. The base of transistor 52 is also connected to ground through a base resistor 94 of equal value to resistor 92 and the coil of resonant circuit 20.

When the instantaneous value of the resonant circuit voltage Vr is zero, the base drive to both transistors 51 and 52 is identical, and thus each transistor conducts one-half of reference source current Is. As Vr increases, however, base drive to transistor 52 from transistor 84 increases above that provided to transistor switch 51 from base bias transistor 86. This increases the share of reference source current Is carried by transistor 52, and decreases, by an equal amount, the share conducted by transistor 51. When Vr equals +Vk, transistor 52 is in saturation and transistor 51 is in cutoff such that all the reference source current Is is conducted by transistor 52 to input 44 of the mirror circuit 42 and substantially no current is conducted by transistor 51. When the resonant circuit voltage Vr decreases below zero volts, just the opposite occurs.

The mirror circuit serves as the source of input current Ir to the resonant circuit 20. It comprises two virtually identical circuits: an input curcuit 96 and an output circuit 98. Reference current I'r is conducted through input circuit 96. Output circuit 98 provides on output 43 input current Ir to the resonant circuit having a magnitude substantially equal to reference current I'r.

Input circuit 96 includes a PNP transistor 100 and an NPN transistor 102 connected therewith. PNP transistor 100 has its emitter connected to the collector of transistor 102 and its collector connected to the base of transistor 102. A resistor 104 connects the emitter of transistor 100 and the collector of transistor 102 to positive voltage V+. A second resistor 106 is connected between the base and emitter of transistor 102. Finally, input 44 is connected to the base of transistor 100 through a diode 108.

Output circuit 98 has a pair of transistors 110 and 112 and a pair of resistors 114 and 118 connected together with one another in identical fashion as transistors 96 and 102 and resistors 104 and 106 of input circuit 96 respectively. Transistors 100 and 110 and transistors 102 and 112 are respectively matched with regard to their characteristics. Resistor 104 has a value equal to that of resistor 114, and resistors 106 and 118 are likewise the same value.

The base of transistor 100 is connected with the base of transistor 110. Thus, the respective base emitter junctions of transistors 100 and 110 are connected in parallel, and the voltage across each is identical. The emitter current through transistor 102 is established by the reference current I'r conducted through transistor 52, which in turn sets the collector current of transistor 100. A base drive to transistor 110 equal to that of transistor 100 is developed which corresponds to the emitter current of transistor 102. This results in an emitter current Ir of transistor 112 substantially identical to reference current I'r.

Figure 4B:
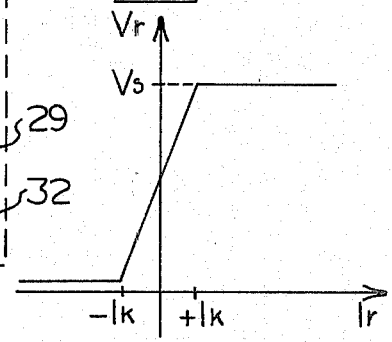
FIG. 4B is a graph of output current Ir vs. input voltage Vr of the resonant circuit of the linear oscillator of FIG. 4A.

It should be understood that the invention is not limited to the specific circuitry shown in FIGS. 7 and 8, or to the transfer functions shown in FIG. 3B and FIG. 4B. For instance, the current mirror circuit is provided merely to isolate the resonant circuit from transistor switch 52 so that the output voltage across the resonant circuit can be used to control the application of the current thereto. This same result will of course be achieved by connecting the resonant circuit in series with the switch as shown in FIG. 3A. and utilizing some other form of isolation in the circuit to turn the switch on and off as required. Also, it is, of course, not necessary to maximize the input power to the resonant circuit to achieve the desirable characteristics outlined above.

We claim:

1. In an oscillator having a series resonant circuit wherein the effective impedance and Q, and thus power loss at resonance, is a function of the distance of a part of the resonant circuit from a conductive body, the improvement comprising:

a source of current and voltage components of electrical power, the voltage component being substantially independent of changes of load impedance and Q; and means for switching said power source across the resonant circuit, the power loss of said resonant circuit being directly proportional to the effective series resistance of the resonant circuit whereby current oscillations occur in said resonant circuit having an amplitude which varies inversely with the effective series resistance of the resonant circuit.

2. The oscillator of claim 1 wherein the inverse of effective series resistance of the resonant circuit is linearly related to said distance whereby the peak amplitude of current oscillations is linearly related to said distance.

3. The oscillator of claim 1 in which said switching means includes a switch having one state in which the source of voltage is applied across the resonant circuit and another state in which the source voltage is removed from the resonant circuit, and means for controlling the switch in response to the magnitude of the current, said switch control means causing the switch to assume its one state in response to the magnitude of the current falling within a selected range of values and causing it to assume its other state in response to the magnitude of the current falling within a second range of values.

4. The oscillator of claim 3 in which the current amplitude oscillates between opposite polarities above and below a reference and the two preselected ranges of current amplitude to which the switch control means is responsive are of opposite polarities.

5. The oscillator of claim 4 in which the absolute values of the preselected amplitudes of current are substantially equal.

6. In an oscillator having a parallel resonant circuit wherein the effective impedance and Q, and thus power loss at resonance, is a function of the distance of a part of the resonant circuit from a conductive body, the improvement comprising:

a source of current and voltage components of electrical power, said power source including means for providing a reference current of a selected magnitude and a controlled current source having an input and an output for providing a constant current to the resonant circuit through said output proportional to the reference current when applied to said input, said constant current being substantially independent of changes of load impedance Q and the voltage amplitude across the resonant circuit varying with load impedance Q; and means for switching said power source to provide input power to the resonant circuit, said switching means including a switch connected between said reference current providing means and the input of the controlled current source, said switch having one state in which the reference current is applied to said input and a second state in which the reference current is not applied to said input, and control means responsive to the voltage across the resonant circuit for changing the state of said switch in accordance therewith, the voltage across said resonant circuit having an amplitude inversely proportional to the power loss of the resonant circuit and varying linearly with the distance of the resonant circuit part from a conductive body.

7. The oscillator of claim 6 in which the switch control means includes means for causing the switch to assume said one state in response to the oscillating voltage of the resonant circuit assuming a first selected value and for causing the switch to assume said second state in response to the oscillating voltage assuming a second selected value.

8. The oscillator of claim 7 in which the oscillating voltage of the resonant circuit oscillates above and below a reference potential and said first and second values of the oscillating voltage are of opposite polarity with respect to said reference potential.

9. The oscillator of claim 8 in which said first and second values of the oscillating voltage are of equal magnitude.

10. The oscillator of claim 6 in which said controlled current source applies a current to the resonant circuit substantially equal to the reference current applied thereto.

11. The oscillator of claim 6 wherein said power source includes control means including a second switch connected in parallel with said one switch and said power source and in series with said reference current source and means responsive to said one switch assuming a nonconductive state to remove reference current from the controlled current source input for turning on the second switch for providing an alternate path for reference current not applied to the controlled current source input whereby said reference current source is continuously maintained in a steady state condition.

12. The oscillator of claim 11 including means for selectively varying the magnitude of said reference current.

13. In an oscillator having a parallel resonant circuit wherein the effective impedance and Q and thus power loss at resonance is a function of the distance of a part of the resonant circuit from a conductive body, the improvement comprising:

a source of constant current;

a voltage controlled differential switch including two switch transistors connected in parallel and connected in series with said constant current source, said switch transistors being alternately conductive;

means connecting one of said switch transistors to the resonant circuit of said oscillator to provide a constant current input to the resonant circuit;

a common bias circuit for said two transistor switches; and a circuit connected between said resonant circuit and said differential switch to cause said one switch transistor to conduct periodically and provide constant current input to said resonant circuit.

14. The oscillator of claim 13 in which said common bias circuit includes a pair of matched transistors, one connected to bias each of said switch transistors, and a common drive circuit for said matched transistors.

15. In an oscillator having a parallel resonant circuit wherein the effective impedance and Q and thus power loss of resonance is a function of the distance of a part of the resonant circuit from the conductive body, the improvement comprising:

a source of constant current including a transistor connected in series with a resistor across a DC power source;.

a control circuit for said constant current transistor including a series regulated current source connected with the base of the constant current transistor; and means for switching said constant current source to the resonant circuit to establish oscillations therein.

16. The oscillator of claim 15 in which said series regulated current source of said control includes means for varying the drive to the constant current source transistor and thus the level of the constant current.

* * * * *

Disclaimer 4,001,718.—*Michael A. Wilson; Gordon E. Gee*, both of Sarasota; *Fred J. Momparler*, Bradenton, all of Fla. LINEAR OSCILLATOR FOR PROXIMITY SENSOR. Patent dated Jan. 4, 1977. Disclaimer filed Oct. 5, 1984, by the assignee, *Electro Corp.*

Hereby enters this disclaimer to claims 15 and 16 of said patent.
[*Official Gazette December 4, 1984.*]